(12) United States Patent
Imai et al.

(10) Patent No.: US 9,385,125 B2
(45) Date of Patent: *Jul. 5, 2016

(54) SEMICONDUCTOR INTEGRATED CIRCUIT DEVICE

(71) Applicant: FUJI ELECTRIC CO., LTD., Kawasaki-shi (JP)

(72) Inventors: Tomohiro Imai, Matsumoto (JP); Masaharu Yamaji, Matsumoto (JP)

(73) Assignee: FUJI ELECTRIC CO., LTD., Kawasaki-shi (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/499,707

(22) Filed: Sep. 29, 2014

(65) Prior Publication Data

US 2015/0014783 A1 Jan. 15, 2015

Related U.S. Application Data

(63) Continuation of application No. PCT/JP2013/071079, filed on Aug. 2, 2013.

(30) Foreign Application Priority Data

Sep. 13, 2012 (JP) ................................ 2012-202126

(51) Int. Cl.
*H01L 27/092* (2006.01)
*H01L 21/8238* (2006.01)
(Continued)

(52) U.S. Cl.
CPC .......... *H01L 27/0921* (2013.01); *H01L 21/761* (2013.01); *H01L 21/823871* (2013.01);
(Continued)

(58) Field of Classification Search
CPC ................... H01L 27/0921; H01L 21/823871; H01L 27/092; H01L 29/0649; H01L 29/1083; H01L 27/1207; H01L 21/761; H01L 21/823878

See application file for complete search history.

(56) References Cited

U.S. PATENT DOCUMENTS 8,841,744 B2 * 9/2014 Imai .................... H01L 27/0248
257/491
2006/0131651 A1 6/2006 Sato et al.
(Continued)

FOREIGN PATENT DOCUMENTS

JP 2001144276 A 5/2001
JP 2005191263 A 7/2005
(Continued)

OTHER PUBLICATIONS

International Search Report issued in PCT/JP2013/071079 mailed on Oct. 22, 2013. English translation provided.

*Primary Examiner* — Jarrett Stark
(74) *Attorney, Agent, or Firm* — Rossi, Kimms & McDowell LLP

(57) ABSTRACT

An MV-PMOS and MV-NMOS configuring a high side drive circuit are formed in an n-type isolation region formed on a p-type semiconductor substrate. The MV-NMOS is connected to a p-type isolation region of an intermediate potential in the interior of the n-type isolation region. An n-type epitaxial region is provided in a surface layer of the p-type semiconductor substrate on the outer side of the n-type isolation region, and a p-type GND region of a ground potential (GND) is provided on the outer side of the n-type epitaxial region. A cavity is provided between the p-type semiconductor substrate and n-type epitaxial region between the high side drive circuit and p-type GND region, and a p-type diffusion region is provided penetrating the n-type epitaxial region and reaching the cavity. The intermediate potential is applied to the p-type isolation region.

14 Claims, 15 Drawing Sheets

(51) Int. Cl.
*H01L 21/761* (2006.01)
*H01L 27/12* (2006.01)
*H01L 29/06* (2006.01)
*H01L 29/10* (2006.01)

(52) U.S. Cl.
CPC ...... *H01L21/823878* (2013.01); *H01L 27/092* (2013.01); *H01L 27/1207* (2013.01); *H01L 29/0649* (2013.01); *H01L 29/1083* (2013.01)

(56) References Cited

U.S. PATENT DOCUMENTS

| | | |
|---|---|---|
| 2007/0023782 A1 | 2/2007 | Yamazaki |
| 2007/0090458 A1 | 4/2007 | Muramoto et al. |
| 2008/0003771 A1 | 1/2008 | Sato et al. |
| 2008/0237659 A1* | 10/2008 | Yang ............... H01L 21/823412 257/288 |
| 2009/0212373 A1 | 8/2009 | Karino et al. |
| 2010/0283116 A1 | 11/2010 | Shimizu |
| 2012/0267750 A1 | 10/2012 | Imai et al. |

FOREIGN PATENT DOCUMENTS

| | | |
|---|---|---|
| JP | 2007036062 A | 2/2007 |
| JP | 2007266561 A | 10/2007 |
| JP | 2007273993 A | 10/2007 |
| JP | 2009206284 A | 9/2009 |
| JP | 2009231851 A | 10/2009 |
| JP | 2010263116 A | 11/2010 |
| JP | 2012227300 A | 11/2012 |

* cited by examiner

SEMICONDUCTOR INTEGRATED CIRCUIT DEVICE

CROSS-REFERENCE TO RELATED APPLICATIONS

This application is a continuation of International Application No. PCT/JP2013/071079, filed on Aug. 2, 2013, which is based on and claims priority to Japanese Patent Application No. JP 2012-202126, filed on Sep. 13, 2012. The disclosure of the Japanese priority application and the PCT application in their entirety, including the drawings, claims, and the specification thereof, are incorporated herein by reference.

BACKGROUND OF THE INVENTION

1. Field of the Invention

The present invention relates to a semiconductor integrated circuit device.

2. Related Art

Besides motor control inverters, power devices are widely utilized in a large number of fields, such as a power supply application of a PDP (plasma display panel), liquid crystal panel, or the like, with a large capacitive load, or an inverter application for household appliances such as air conditioners or lighting. In recent years, owing to advances in LSI technology, high voltage ICs (HVIC: High Voltage Integrated Circuit) wherein a high voltage of up to 1,200V is ensured have been put to practical use.

ICs wherein upper and lower arm driver functions are mounted on one silicon chip, and furthermore, ICs wherein a control circuit or power semiconductor device is also mounted on one silicon chip, and the like, are grouped as HVICs, and also contribute to increased efficiency and a reduction in part quantities as whole inverters. A description will be given of a circuit configuration of a high voltage IC, with a motor control inverter including a motor as a load as an example. FIG. 9 is a circuit diagram showing a configuration of a main portion (one phase) of a high voltage driver IC. FIG. 10 is a characteristic diagram showing fluctuation of an intermediate potential Vs when a power module 100 operates. FIG. 10 shows the intermediate potential Vs fluctuation of a connection point 105 when a first MOSFET 101 and second MOSFET 102 are turned on and off in a complementary way.

As shown in FIG. 9, a drive circuit 111 is a circuit that drives the power module 100. The power module 100 is a single phase inverter circuit wherein the high side first MOSFET (insulated gate field effect transistor) 101 (upper arm output element) and the low side second MOSFET 102 (lower arm output element) are connected in series, and drives a motor 112, which is the load. Reference sign 103 and reference sign 104 are FWDs (freewheeling diodes).

The drain of the first MOSFET 101 is connected to a main power supply Vds. The source of the first MOSFET 101 is connected to the drain of the second MOSFET 102. The source of the second MOSFET 102 is connected to the ground. The connection point 105 of the source of the first MOSFET 101 and the drain of the second MOSFET 102 is an output point of a main circuit formed of the power module 100.

The intermediate potential Vs fluctuates by repeatedly rising (hereafter referred to as a first state 121) and falling (hereafter referred to as a second state 122) between a high potential side potential (for example, 400V) and a low potential side potential (for example, a ground potential GND of 0V) of the main power supply Vds in accordance with the first MOSFET 101 and second MOSFET 102 being turned on and off in a complementary way (FIG. 10).

The drive circuit 111 has a control unit, high side drive circuit, low side drive circuit, and level shifter, omitted from the drawing. The high side drive circuit operates in accordance with a high side power supply potential VB applied to a VB terminal having the intermediate potential Vs applied to a Vs terminal as a reference, thus driving the first MOSFET 101. The low side drive circuit operates in accordance with a low side power supply potential Vcc applied to a Vcc terminal having the ground potential GND as a reference, thus driving the second MOSFET 102.

Specifically, a low side level turn-on/turn-off signal output from the control unit is input via the low side drive circuit from a low side output terminal LO into the gate of the second MOSFET 102. Also, the low side level turn-on/turn-off signal is converted by the level shifter into a high side level turn-on/turn-off signal. The high side level turn-on/turn-off signal is input via the high side drive circuit from a high side output terminal HO into the gate of the first MOSFET 101.

An HIN terminal and LIN terminal are respectively a high side control signal input terminal and low side control signal input terminal that form references when the high side level turn-on/turn-off signal and low side level turn-on/turn-off signal are generated in the drive circuit 111. Each input/output terminal of the drive circuit 111 is normally connected to a computer such as a microcomputer, and the drive circuit 111 is controlled by a program prepared in advance being executed by the computer, whereby control of the whole high voltage driver IC is carried out.

In this kind of motor control inverter, the main power supply Vds is normally a high voltage of 100V to 400V AC (alternating current). In particular, in the first state 121 wherein the first MOSFET 101 is in an on-state and the second MOSFET 102 is in an off-state, the source potential of the first MOSFET 101 is a high potential. As it is necessary for the gate potential to be higher still than the source potential in order to drive the first MOSFET 101, a photocoupler (PC) or high voltage IC (HVIC) that can be used with a high voltage power supply is used as the drive circuit 111.

A description will be given of the structure of a heretofore known high side drive circuit. FIG. 11 is a plan view showing a planar structure of the heretofore known high side drive circuit. FIG. 12 is a sectional view showing a sectional structure along a section line AA-AA' of FIG. 11. As shown in FIGS. 11 and 12, a high side drive circuit formation region 130, in which the high side drive circuit is formed, and a high voltage termination region (HVJT: High Voltage Junction Termination) 140, which ensures the breakdown voltage of the high side drive circuit, are formed in a p-type semiconductor substrate (semiconductor chip) 131.

An n-type isolation region 132 is selectively formed in a surface layer of the p-type semiconductor substrate 131. A lateral p-channel MOSFET (MV-PMOS) 133 and lateral n-channel MOSFET (MV-NMOS) 134 configuring the high side drive circuit are formed in a surface layer of the n-type isolation region 132. The MV-NMOS 134 is formed in a p-type isolation region 135 provided in a surface layer of the n-type isolation region 132. Also, a p-type region 141 is formed in the HVJT 140 in a surface layer of the p-type semiconductor substrate 131 on the outer side of the n-type isolation region 132.

The ground potential GND is applied to the p-type region (hereafter referred to as the p-type GND region) 141. The high side power supply potential VB is applied to the n-type isolation region 132 via an $n^{++}$ type region 151, or the like. By the first MOSFET 101 and second MOSFET 102 configuring the inverter being turned on and off in a complementary way, a surge voltage 121a occurs in the first state 121 wherein the first MOSFET 101 is in an on-state and the second MOSFET 102 is in an off-state, and the intermediate potential Vs transiently rises (FIG. 10).

Meanwhile, in the second state 122 wherein the first MOSFET 101 is in an off-state and the second MOSFET 102 is in an on-state, a negative surge 122a occurs for in the region of a few hundred nanoseconds in the connection point 105 of the first MOSFET 101 and second MOSFET 102 (FIG. 10). When the negative surge 122a occurs, the intermediate potential Vs becomes lower than the ground potential GND. When the high side power supply potential VB also becomes lower than the ground potential GND in accompaniment to this, a parasitic diode formed of the p-type GND region 141 (ground potential GND) and n-type isolation region 132 is turned on, and holes 142 flow from the p-type GND region 141 to the high side drive circuit formation region 130. Because of this, there is a problem in that the high side drive circuit malfunctions.

The following device has been proposed as a high voltage IC that resolves the problem. A $p^+$ type impurity region is formed so as to come in contact with a p-type well in an upper surface of an n-type impurity region between an NMOS and a PMOS. An electrode is formed on the $p^+$ type impurity region, and the electrode is connected to a high voltage side floating offset voltage VS. The impurity concentration of the $p^+$ type impurity region is higher than the impurity concentration of the p-type well, and the $p^+$ type impurity region is formed to be shallower than the p-type well. An $n^+$ type impurity region is formed in the upper surface of the n-type impurity region between the $p^+$ type impurity region and PMOS. An electrode is formed on the $n^+$ type impurity region, and the electrode is connected to a high voltage side floating supply absolute voltage VB. See, for example, Japanese Patent Application Publication No. JP-A-2009-231851 (also referred to herein as "PTL 1").

Also, a device wherein a high voltage diode D3 is provided between a common ground node (COM) and virtual ground node (VS) in the interior of a high voltage control circuit (HVIC) utilizing a common substrate region has been proposed as another device. See, for example, Japanese Patent Application Publication No. JP-A-2010-263116 (also referred to herein as "PTL 2").

Also, a semiconductor device such that MOS transistors isolated by a first isolation trench are formed, n-fold (n≥2) second isolation trenches are formed, one MOS transistor is disposed in each of n field regions, the n MOS transistors are sequentially connected in series between a ground (GND) potential and a predetermined power supply potential, and output is extracted from between a power supply potential side terminal of an $n^{th}$ stage MOS transistor and an output resistor, wherein the potential of a field region enclosed by the innermost second isolation trench is fixed at the power supply potential, has been proposed as another device. See, for example, Japanese Patent Application Publication No. JP-A-2007-266561 (also referred to herein as "PTL 3").

The following device has been proposed as a device including a high potential portion and low potential portion isolated by a dielectric region on the same semiconductor substrate. A high voltage junction termination structure portion is provided in a peripheral portion of a high potential gate drive circuit in order to electrically isolate from a low potential gate drive circuit provided on the same semiconductor substrate. Further, trenches are provided in the high voltage junction termination structure portion and between an $n^+$ type source layer and $n^+$ type drain layer of a level shifter circuit portion provided in one portion of the high potential gate drive circuit. Also, oxide films, or the like, are deposited inside the trenches, forming a dielectric region. See, for example, Japanese Patent Application Publication No. JP-A-2009-206284 (also referred to herein as "PTL 4").

A device including a semiconductor substrate having a plate form cavity in the interior thereof and a passive element formed on the surface of the semiconductor substrate above the cavity has been proposed as a device wherein a dielectric region is provided on a semiconductor substrate. See, for example, Japanese Patent Application Publication No. JP-A-2001-144276 (also referred to herein as "PTL 5").

SUMMARY OF INVENTION

However, the high side drive circuit shown in FIGS. 11 and 12 is such that, in order to avoid a flow of the holes 142 from the HVJT 140 into the high side drive circuit formation region 130 when the negative surge 122a occurs in the connection point 105 of the first MOSFET 101 and second MOSFET 102, thus preventing malfunction of the high side drive circuit, it is necessary that an interval x between the $n^{++}$ type region 151, disposed in the HVJT 140 and to which the high side power supply potential VB is applied, and the high side drive circuit (the MV-PMOS 133, MV-NMOS 134, and the like) in the high side drive circuit formation region 130 is 100 μm or more. Because of this, there is a problem in that the chip size increases.

Also, when simply providing a p-type impurity region for extracting holes flowing into the high side drive circuit when a negative surge occurs (hole pick-up) in the circuit periphery, as in PTL 1, there is concern that, depending on the size of the intermediate potential Vs, the hole pick-up p-type impurity region will punch through to the p-type semiconductor substrate. Also, when disposing a high voltage diode between a region to which the ground potential GND is applied and a region to which the intermediate potential Vs is applied, as in PTL 2, the chip size increases by an amount equivalent to the size of the high voltage diode.

Also, when providing a trench structure as in PTL 3, the hole pick-up effect in a bottom portion of the trench decreases. Because of this, when a load current of a power device (for example, an upper arm output element of an inverter) driven by the high side drive circuit, or the floating inductance (L component) accompanying a load (for example, a motor) driven by a power device, is large, there is a problem in that the high side drive circuit malfunctions, leading to latch-up.

SUMMARY OF THE INVENTION

The invention, in order to resolve the problems of the heretofore described heretofore known technology, has an object of providing a semiconductor integrated circuit device such that it is possible to avoid an occurrence of malfunction or destruction. Also, the invention, in order to resolve the problems of the heretofore described heretofore known technology, has an object of providing a semiconductor integrated circuit device such that it is possible to reduce chip size.

In order to resolve the heretofore described problems, thus achieving the objects of the invention, a semiconductor integrated circuit device according to an aspect of the invention has the following characteristics. A second conductivity type region is provided in a surface layer of a first conductivity type semiconductor substrate. A circuit portion is formed in the second conductivity type region, and a first potential, which is a high voltage potential of a power supply of the circuit portion, is applied. A first conductivity type well region to which is applied a second potential, which is a low voltage potential of the power supply, is provided in the interior of the second conductivity type region. The first conductivity type well region configures the circuit portion. A first conductivity type low potential region to which is applied a third potential lower than the second potential is provided in a surface layer of the first conductivity type semiconductor substrate on the outer side of the second conductivity type region. A cavity is selectively provided between the circuit portion and first conductivity type low potential region and between the first conductivity type semiconductor substrate and second conductivity type region. A first conductivity type region penetrating the second conductivity type region and reaching the cavity is provided.

Also, the semiconductor integrated circuit device according to the heretofore described aspect of the invention is characterized in that the second potential is applied to the first conductivity type region.

Also, the semiconductor integrated circuit device according to the heretofore described aspect of the invention is characterized in that the cavity extends from the first conductivity type region toward the first conductivity type low potential region side.

Also, the semiconductor integrated circuit device according to the heretofore described aspect of the invention is characterized in that the cavity is provided from the first conductivity type region to the first conductivity type low potential region.

Also, the semiconductor integrated circuit device according to the heretofore described aspect of the invention is such that the circuit portion drives a first element of an output circuit (power module) configured of the first element connected to a high voltage potential side of a main power supply and a second element connected in series to the first element and connected to a low voltage potential side of the main power supply. Further, the semiconductor integrated circuit device is characterized in that the second potential is the potential of a connection point of the first element and second element, and the third potential is the low voltage potential of the main power supply.

Also, the semiconductor integrated circuit device according to the heretofore described aspect of the invention is characterized in that a punch-through breakdown voltage of the first conductivity type region and first conductivity type semiconductor substrate is set to be higher than the potential of the connection point of the first element and second element of the output circuit, which transiently rises when the first element is in an on-state and the second element is in an off-state.

Also, the semiconductor integrated circuit device according to the heretofore described aspect of the invention is characterized by further including a voltage withstand region enclosing the circuit portion and disposed in the second conductivity type region, and an insulated gate field effect transistor configuring a level shifter having the drain on the inner side of the voltage withstand region and the source on the outer side of the voltage withstand region, wherein the cavity is disposed between the circuit portion and the drain of the insulated gate field effect transistor.

Also, in order to resolve the heretofore described problems, thus achieving the objects of the invention, a semiconductor integrated circuit device according to an aspect of the invention has the following characteristics. A first second conductivity type region is provided in a surface layer of a first conductivity type semiconductor substrate. A circuit portion is formed in the first second conductivity type region, and a first potential, which is a high voltage potential of a power supply of the circuit portion, is applied. A first conductivity type well region to which is applied a second potential, which is a low voltage potential of the power supply, is provided in the interior of the first second conductivity type region. The first conductivity type well region configures the circuit portion. A second second conductivity type region is provided in a surface layer of the first conductivity type semiconductor substrate on the outer side of the first second conductivity type region. A first conductivity type low potential region to which is applied a third potential lower than the second potential is provided in a surface layer of the first conductivity type semiconductor substrate on the outer side of the second second conductivity type region. A cavity is selectively provided between the circuit portion and first conductivity type low potential region and between the first conductivity type semiconductor substrate and second second conductivity type region. A first conductivity type region penetrating the second second conductivity type region and reaching the cavity is provided between the first second conductivity type region and second second conductivity type region. An insulated gate field effect transistor configuring a level shifter is disposed in the second second conductivity type region. Further, a second conductivity type high concentration region connected to the first potential is not disposed in a portion of the second second conductivity type region sandwiched between the drain of the insulated gate field effect transistor and the first conductivity type region.

Also, the semiconductor integrated circuit device according to the heretofore described aspect of the invention is characterized in that the second potential is applied to the first conductivity type region.

Also, the semiconductor integrated circuit device according to the heretofore described aspect of the invention is characterized in that the cavity is disposed between the circuit portion and the drain of the insulated gate field effect transistor.

Also, the semiconductor integrated circuit device according to the heretofore described aspect of the invention is characterized in that the drain of the insulated gate field effect transistor is disposed on the circuit portion side of the second second conductivity type region, and the source of the insulated gate field effect transistor is disposed on the first conductivity type low potential region side of the second second conductivity type region.

Also, the semiconductor integrated circuit device according to the heretofore described aspect of the invention is characterized in that the circuit portion drives a first element of an output circuit configured of the first element connected to a high voltage potential side of a main power supply and a second element connected in series to the first element and connected to a low voltage potential side of the main power supply, wherein the second potential is the potential of a connection point of the first element and second element, and the third potential is the low voltage potential of the main power supply.

Also, the semiconductor integrated circuit device according to the heretofore described aspect of the invention is characterized in that a punch-through breakdown voltage of the first conductivity type region and first conductivity type semiconductor substrate is set to be higher than the potential of the connection point of the first element and second element of the output circuit, which transiently rises when the first element is in an on-state and the second element is in an off-state.

Also, the semiconductor integrated circuit device according to the heretofore described aspect of the invention is characterized by further including a resistance layer provided across a dielectric on the surface of the first second conductivity type region, wherein the drain of the insulated gate field effect transistor is electrically connected to the resistance layer via a wiring layer disposed on the first conductivity type semiconductor substrate.

According to the invention, by the cavity being formed between the first conductivity type low potential region and first conductivity type isolation region, and the first conductivity type region being provided above the cavity to a depth reaching the cavity, it is possible to extract holes flowing from the first conductivity type low potential region to the first conductivity type isolation region when negative surge occurs in the connection point of the first and second elements, and thus possible to reduce (practically eliminate) hole implantation.

Also, according to the invention, the first conductivity type region is not deeper than a depth reaching the cavity, because of which it is possible to prevent the first conductivity type region from punching through to the first conductivity type semiconductor substrate due to a transient rise in the potential of the connection point of the first element and second element. Also, according to the invention, it is possible to reduce (practically eliminate) hole implantation by the hole pick-up first conductivity type region being provided to a depth reaching the cavity, because of which it is possible to reduce the interval between the first conductivity type low potential region and the circuit portion.

According to the semiconductor integrated circuit device according to the invention, there is an advantage in that it is possible to avoid an occurrence of malfunction or destruction. Also, according to the semiconductor integrated circuit device according to the invention, there is an advantage in that it is possible to reduce chip size.

DETAILED DESCRIPTION

Hereafter, referring to the attached drawings, a detailed description will be given of preferred embodiments of a semiconductor integrated circuit device according to the invention. In the description and attached drawings, a layer or region being prefixed by n or p means that electrons or holes respectively are majority carriers. Also, + or − attached to n or p means that there is a higher impurity concentration or lower impurity concentration respectively than in a layer or region to which + or − is not attached. In the following description of the embodiments and the attached drawings, the same reference signs are given to the same configurations, and redundant descriptions are omitted.

Embodiment 1

Figure 1:
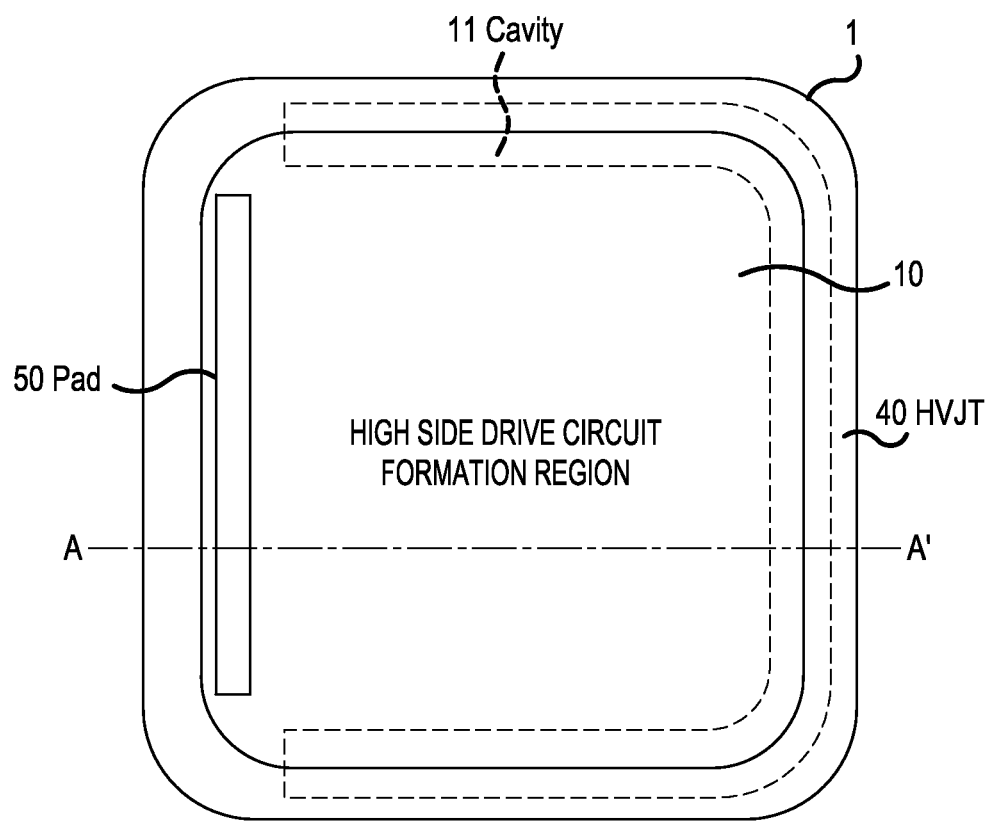
FIG. 1 is a plan view showing a planar structure of a semiconductor integrated circuit device according to Embodiment 1.
Figure 2:
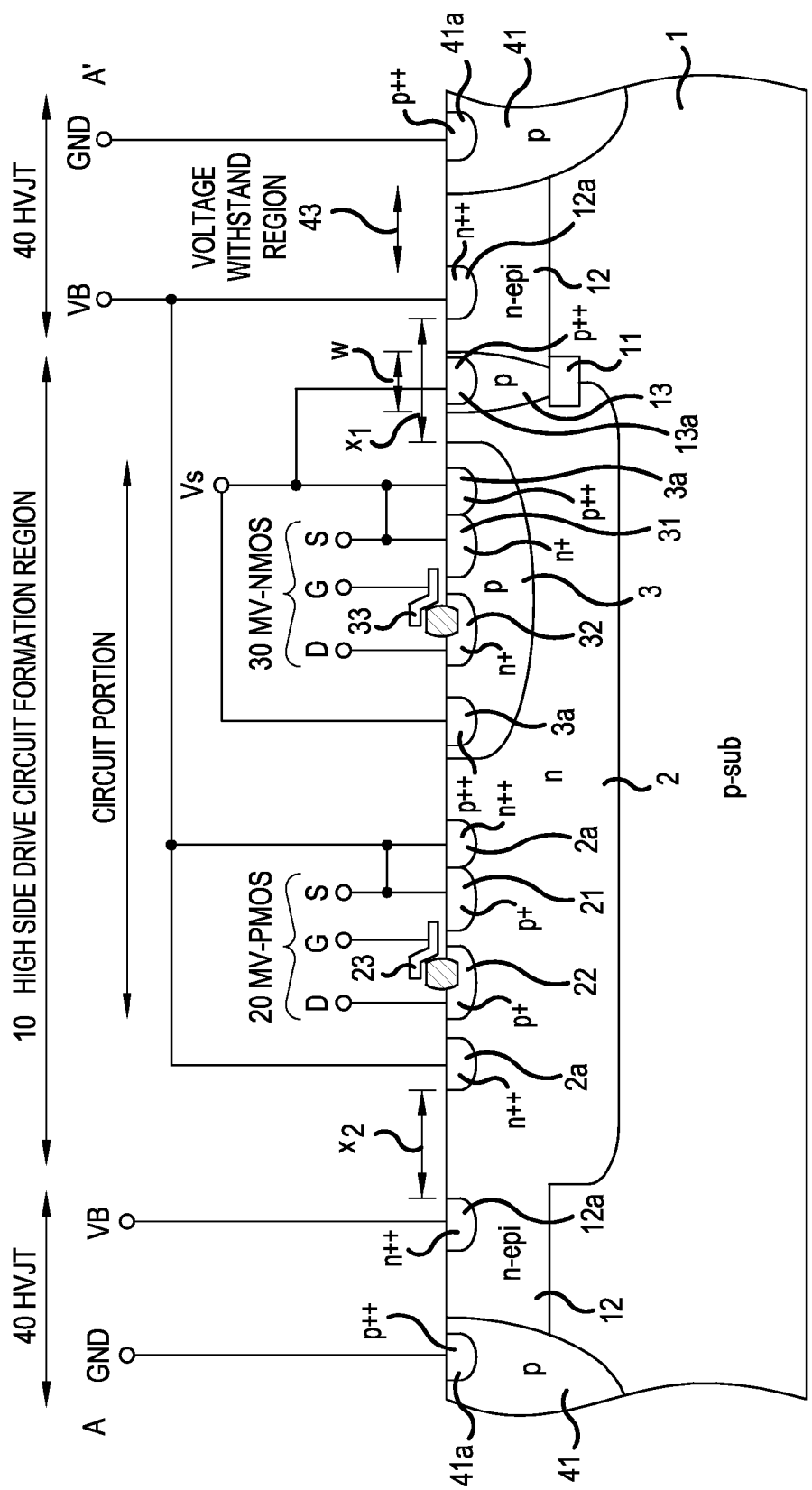
FIG. 2 is a sectional view showing a sectional structure along a section line A-A' of FIG. 1.

A description will be given of a semiconductor integrated circuit device according to Embodiment 1, using as an example a high side drive circuit that drives an upper arm output element of a drive circuit wherein upper and lower arm driver functions are mounted on one silicon chip. FIG. 1 is a plan view showing a planar structure of the semiconductor integrated circuit device according to Embodiment 1. FIG. 2 is a sectional view showing a sectional structure along a section line A-A' of FIG. 1. As the configuration of a drive circuit including the semiconductor integrated circuit device according to Embodiment 1 is the same as, for example, the configuration (one phase) of a drive circuit 111 shown in FIG. 9, a description will be omitted.

Figure 9:
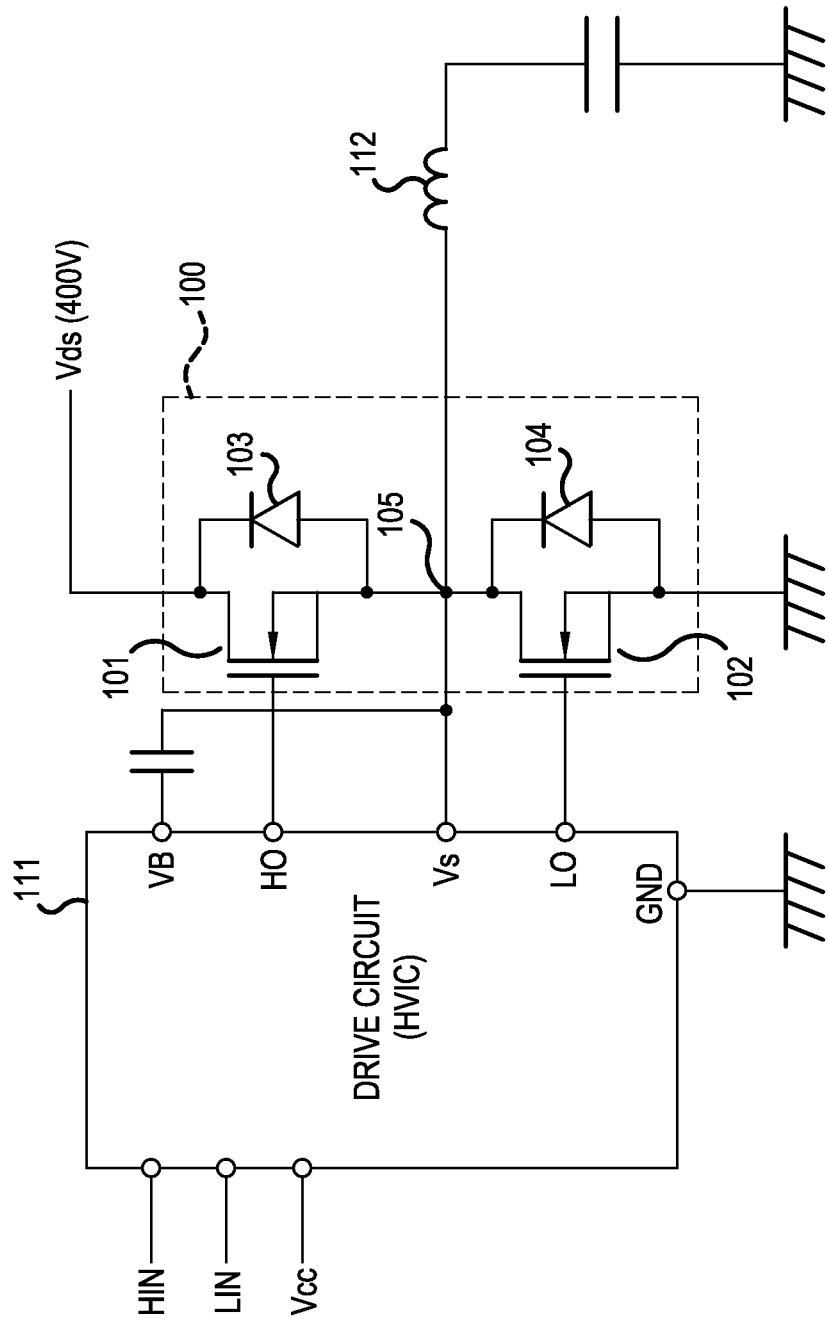
FIG. 9 is a circuit diagram showing a configuration of a main portion (one phase) of a high voltage driver IC.

The semiconductor integrated circuit device according to Embodiment 1 is, for example, a high side drive circuit of the drive circuit 111, which drives an upper arm output element (first MOSFET 101: first element) of a power module (output circuit) 100 shown in FIG. 9. The high side drive circuit is a high voltage IC (HVIC) that can be used with a high voltage power supply. It is preferable that the high side drive circuit of the drive circuit 111 has a breakdown voltage in the region of, for example, 600V to 1,400V, of the same degree as that of the power module 100 (first and second MOSFETS 101 and 102: first and second elements), which drives a motor 112.

Also, as shown in FIG. 1, a high side drive circuit formation region 10, in which the high side drive circuit (circuit portion) is formed, and a high voltage termination region (HVJT) 40, which ensures the breakdown voltage of the high side drive circuit, are formed in a p-type semiconductor substrate (semiconductor chip) 1 in the semiconductor integrated circuit device according to Embodiment 1. The high side drive circuit formation region 10 is disposed in a surface layer of the p-type semiconductor substrate 1. The HVJT 40 is disposed so as to enclose the high side drive circuit formation region 10.

A cavity 11, which is a dielectric region, is provided at the boundary of the high side drive circuit formation region 10 and HVJT 40 in the interior of the p-type semiconductor substrate 1. That is, the p-type semiconductor substrate 1 is selectively a SON (silicon-on-nothing) structure. The cavity 11 is disposed to a predetermined width from the high side drive circuit formation region 10 side to the HVJT 40 side. Also, the cavity 11, for example, is disposed with an approximate reversed C planar form on three sides of the approximately rectangular high side drive circuit formation region 10. The reason for this is as follows.

An electrode pad 50 to which is bonded bonding wire is disposed on the one side on which the cavity 11 is not formed. The electrode pad 50 is provided in the high side drive circuit formation region 10 in the vicinity of the boundary with the HVJT 40. Specifically, the electrode pad 50 is provided above an n-type isolation region 2, to be described hereafter. A pad to which a high side power supply potential VB is applied, a pad to which an intermediate potential Vs is applied, an output pad for applying a signal to a control terminal of the upper arm output element, and the like, are disposed on the electrode pad 50. In order to prevent the high side drive circuit being affected by shock when bonding the wire, the high side drive circuit is not provided in a region of the n-type isolation region 2 below the electrode pad 50. As the electrode pad 50 has a large width, the interval between the high side drive circuit and an $n^{++}$ type high concentration region 12a provided in the HVJT 40 and connected to the high side power supply potential VB is 100 μm or more owing to the electrode pad 50 being disposed. Because of this, the cavity 11 is disposed with an approximate reversed C planar form on three sides of the approximately rectangular high side drive circuit formation region 10.

In Embodiment 1, a description has been given of a case wherein the high side drive circuit is not formed in the n-type isolation region 2 below the electrode pad 50, but when forming the high side drive circuit in the n-type isolation region 2 below the electrode pad 50, the cavity 11 may be disposed so as to enclose the high side drive circuit formation region 10 on the four sides of the high side drive circuit formation region 10. Also, in the case of Embodiment 1 too, the cavity 11 may be disposed so as to enclose the high side drive circuit formation region 10 on the four sides. Also, when the interval between the high side drive circuit and the $n^{++}$ type high concentration region 12a provided in the HVJT 40 is 100 μm or more on all the other sides, the cavity 11 may be disposed on only one side of the approximately rectangular high side drive circuit formation region 10. A detailed disposition of the cavity 11 will be described hereafter.

FIG. 2 shows a sectional structure along the straight section line A-A' that crosses the electrode pad 50 and cavity 11. As shown in FIG. 2, the n-type isolation region (second conductivity type isolation region) 2 is selectively formed in a surface layer of the p-type semiconductor substrate 1. An end portion of the n-type isolation region 2 covers a region on the lower side (p-type semiconductor substrate 1 side) of the cavity 11. A lateral p-channel MOSFET (MV-PMOS) 20 and lateral n-channel MOSFET (MV-NMOS) 30 configuring the high side drive circuit (the circuit portion indicated by arrows in FIG. 2) are formed in the n-type isolation region 2. The MV-PMOS 20 and MV-NMOS 30 may be, for example, MOSFETS of a breakdown voltage class in the region of 15V to 30V.

The MV-PMOS 20 includes a $p^+$ type source region 21, a $p^+$ type drain region 22, a gate electrode 23, a source electrode (not shown), and a drain electrode (not shown). The $p^+$ type source region 21 and $p^+$ type drain region 22 are provided separated from each other in the interior of the n-type isolation region 2. The high side power supply potential VB is applied to the n-type isolation region 2 from a VB electrode (not shown) electrically connected via an $n^{++}$ type high concentration region 2a provided in the interior of the n-type isolation region 2.

The gate electrode 23 is provided across a gate dielectric (not shown) on the surface of a portion of the n-type isolation region 2 sandwiched between the $p^+$ type source region 21 and $p^+$ type drain region 22. The source electrode and drain electrode of the MV-PMOS 20 are electrically connected to the $p^+$ type source region 21 and $p^+$ type drain region 22 respectively. The source electrode of the MV-PMOS 20 is short-circuited by the VB electrode.

The MV-NMOS 30 is formed in a p-type isolation region (first conductivity type isolation region) 3 provided in a surface layer of the n-type isolation region 2, and includes an $n^+$ type source region 31, an $n^+$ type drain region 32, a gate electrode 33, a source electrode (not shown), and a drain electrode (not shown). The $n^+$ type source region 31 and $n^+$ type drain region 32 are provided separated from each other in the interior of the p-type isolation region 3. The intermediate potential Vs (the potential of a connection point 105 of upper and lower arm output elements) is applied to the p-type isolation region 3 from a Vs electrode (not shown) electrically connected via a $p^{++}$ type high concentration region 3a provided in the interior of the p-type isolation region 3.

The gate electrode 33 is provided across a gate dielectric (not shown) on the surface of a portion of the p-type isolation region 3 sandwiched between the $n^+$ type source region 31 and $n^+$ type drain region 32. The source electrode and drain electrode of the MV-NMOS 30 are electrically connected to the $n^+$ type source region 31 and $n^+$ type drain region 32 respectively. The source electrode of the MV-NMOS 30 is short-circuited by the Vs electrode.

Also, an n-type epitaxial region (second conductivity type isolation region) 12 is provided in the HVJT 40 in a surface layer of the p-type semiconductor substrate 1 on the outer side of the n-type isolation region 2. The n-type epitaxial region 12 is in contact with the n-type isolation region 2, and encloses the high side drive circuit formation region 10. The high side power supply potential VB is applied to the n-type epitaxial region 12 from a VB electrode (not shown) electrically connected via the $n^{++}$ type high concentration region 12a in the interior of the n-type epitaxial region 12.

A p-type region (first conductivity type low potential region) 41 that penetrates the n-type epitaxial region 12 and reaches the p-type semiconductor substrate 1 is provided in a surface layer of the p-type semiconductor substrate 1 on the outer side of the n-type epitaxial region 12. A ground potential GND is applied to the p-type region (hereafter referred to as the p-type GND region) 41 from a GND electrode (not shown) electrically connected via a $p^{++}$ type high concentration region 41a in the interior of the p-type GND region 41. The p-type GND region 41 has a function of fixing the p-type semiconductor substrate 1 at the ground potential GND.

The cavity 11 is provided between the p-type semiconductor substrate 1 and n-type epitaxial region 12 between the high side drive circuit formation region 10 and p-type GND region 41. The cavity 11 may extend from a p-type diffusion region 13, to be described hereafter, toward the p-type GND region 41 side, as far as a region below a voltage withstand region 43. The voltage withstand region 43 is a region between the p-type GND region 41 and the $n^{++}$ type high concentration region 12a to which the high side power supply potential VB is applied inside the n-type epitaxial region 12. The cavity 11 may be in contact with the p-type GND region 41. Also, it is also possible to dispose a level shifter formed of a MOSFET in the HVJT 40, as described in PTL 4.

Figure 13:
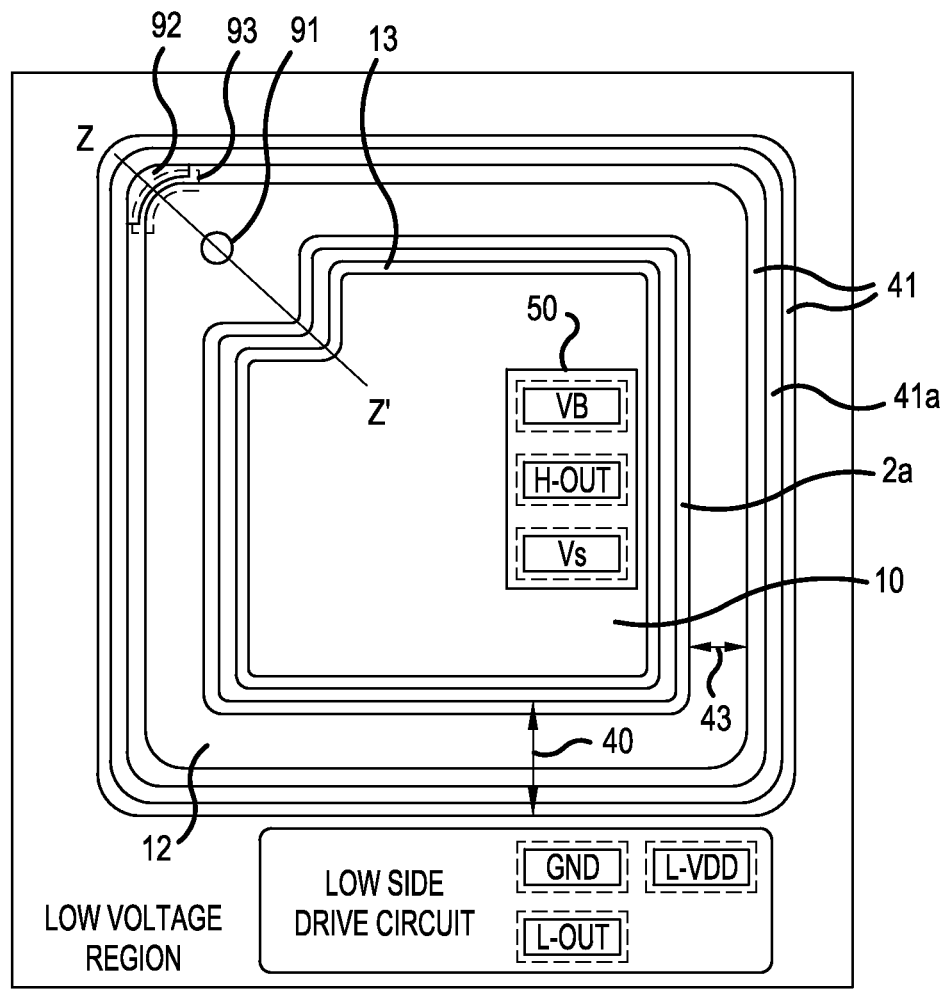
FIG. 13 is a plan view showing another example of a planar structure of the semiconductor integrated circuit device according to Embodiment 1.
Figure 14:
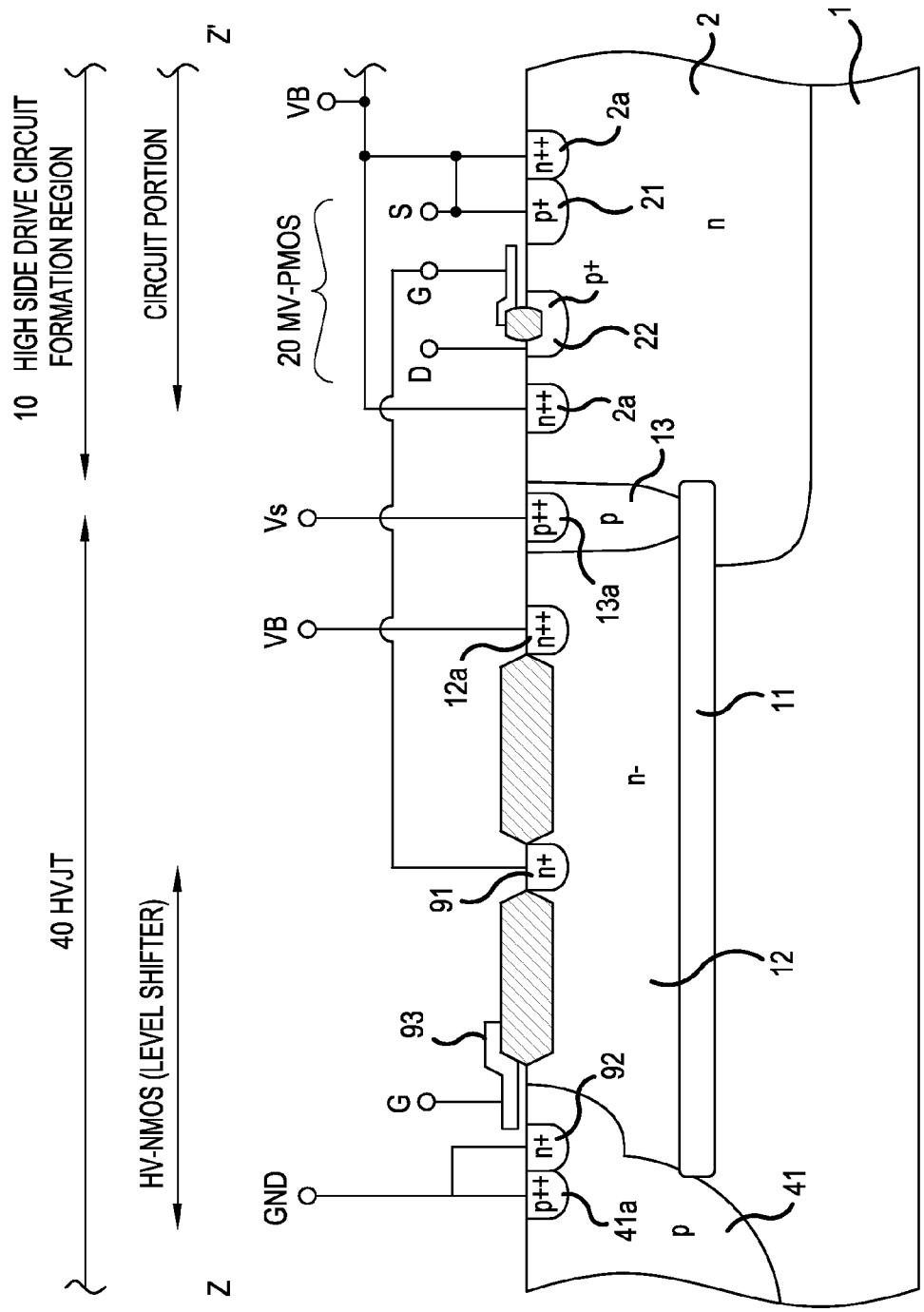
FIG. 14 is a sectional view showing a sectional structure along a section line Z-Z' of FIG. 13.

FIG. 13 is a plan view showing another example of a planar structure of the semiconductor integrated circuit device according to Embodiment 1. FIG. 14 is a sectional view showing a sectional structure along a section line Z-Z' of FIG. 13. It is preferable that the cavity 11 is disposed between a high side drive circuit formed in the high side drive circuit formation region 10 of the p-type semiconductor substrate 1 and an n$^+$ type drain region 91 of a MOSFET (HV-NMOS) configuring a level shifter. Although omitted from FIG. 13, the cavity 11 is disposed on the four sides of the approximately rectangular high side drive circuit formation region 10. In FIG. 14, reference signs 92 and 93 are an n$^+$ type source region and gate electrode respectively of the MOSFET configuring the level shifter.

Also, the p-type diffusion region 13 is provided in the high side drive circuit formation region 10, penetrating the n-type epitaxial region (n$^-$ type region) 12 from the surface of the high side drive circuit formation region 10 and reaching the cavity 11. Specifically, the p-type diffusion region 13 is disposed above the cavity 11 (on the n-type epitaxial region 12 side of the cavity 11) with an approximate reversed C planar form, the same as that of the cavity 11. Also, the p-type diffusion region 13 is provided separated from the high side drive circuit and p-type GND region 41. The intermediate potential Vs is applied to the p-type diffusion region 13 from a Vs electrode electrically connected via a p$^{++}$ type high concentration region 13a provided in the interior of the p-type diffusion region 13.

Figure 10:
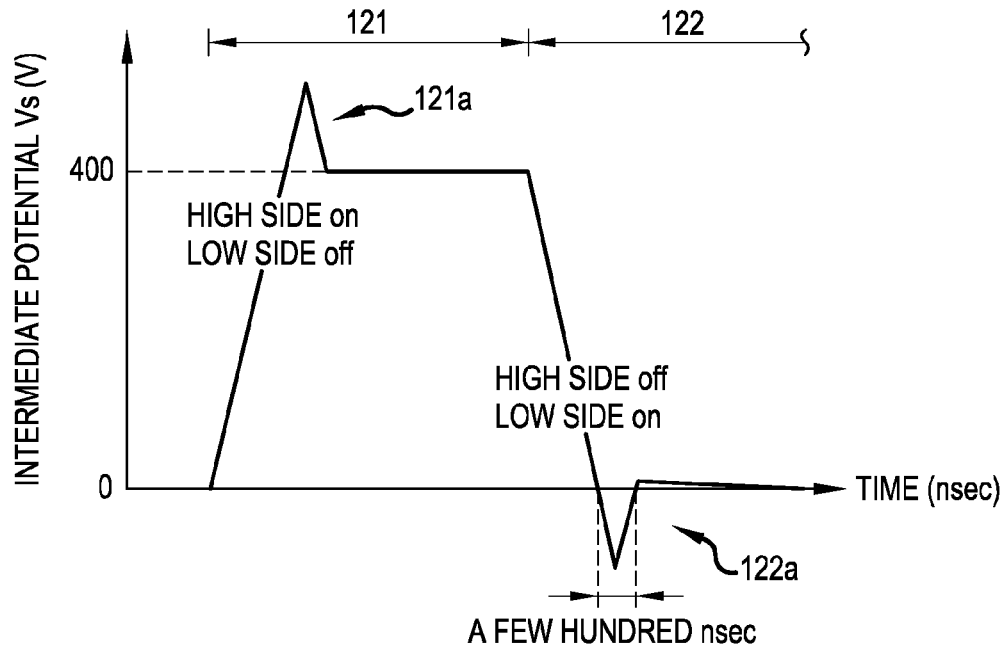
FIG. 10 is a characteristic diagram showing fluctuation of an intermediate potential when a power module operates.
Figure 11:
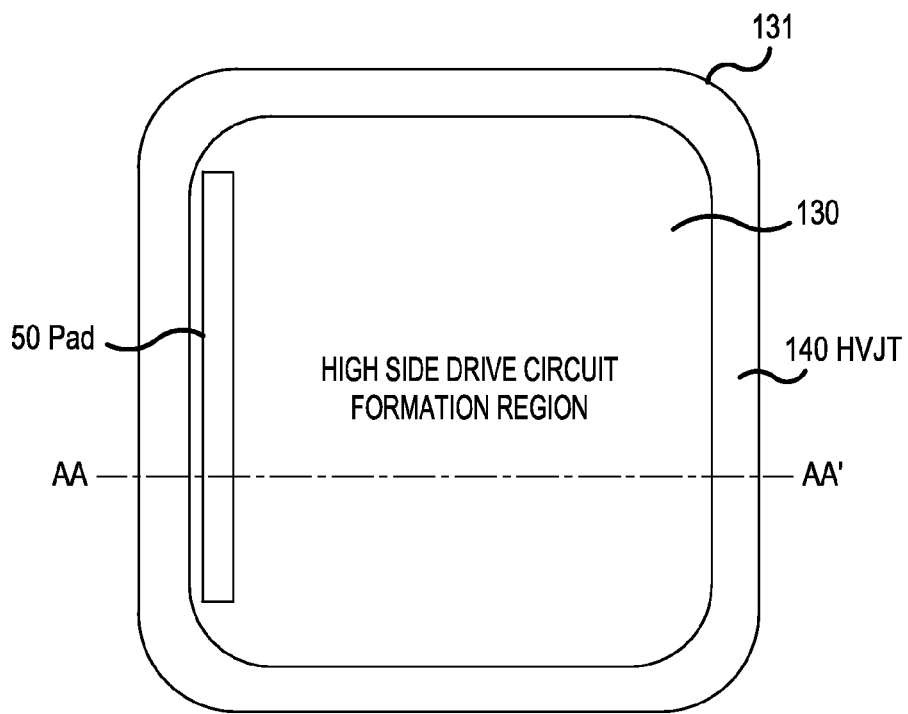
FIG. 11 is a plan view showing a planar structure of a heretofore known high side drive circuit.
Figure 12:
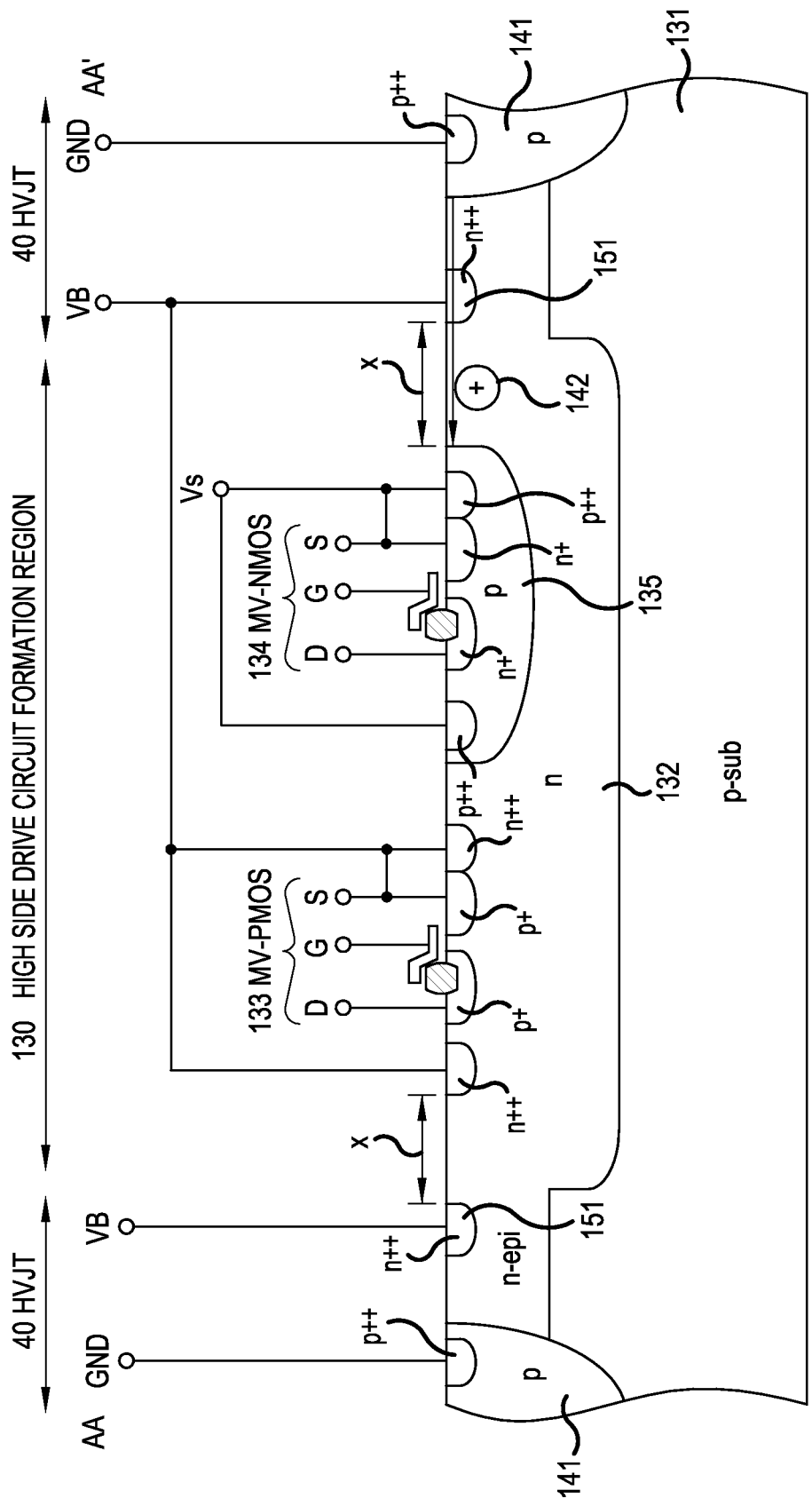
FIG. 12 is a sectional view showing a sectional structure along a section line AA-AA' of FIG. 11.

By the p-type diffusion region 13 being provided, it is possible to extract holes flowing from the p-type GND region 41 into the high side drive circuit formation region 10 from the p-type diffusion region 13 (hole pick-up) when negative surge 122a occurs in the connection point 105 of the upper and lower arm output elements in a second state 122, wherein the upper arm output element is in an off-state and the lower arm output element is in an on-state (FIG. 10). Also, by the p-type diffusion region 13 being provided to a depth such that it reaches the cavity 11, it is possible to reduce (practically eliminate) hole implantation from the p-type GND region 41 to the high side drive circuit formation region 10. Also, as the p-type diffusion region 13 is not deeper than the depth of the cavity 11, it is possible to prevent the p-type diffusion region 13 from punching through to the p-type semiconductor substrate 1 when the intermediate potential Vs transiently rises due to surge voltage 121a occurring in a first state 121, wherein the upper arm output element is in an on-state and the lower arm output element is in an off-state.

As it is possible to practically eliminate hole implantation from the p-type GND region 41 to the high side drive circuit formation region 10 by the p-type diffusion region 13 being provided to a depth such that it reaches the cavity 11, it is sufficient that a first interval $x_1$ between the high side drive circuit and n$^{++}$ type high concentration region 12a in places in which the cavity 11 and p-type diffusion region 13 are formed is in the region of a width w of the p-type diffusion region 13, with no need for the first interval $x_1$ to be 100 μm or more, as is the case to date. Meanwhile, as the electrode pad 50 is disposed on the surface of the high side drive circuit formation region 10 in places in which the cavity 11 and p-type diffusion region 13 are not formed, a second interval $x_2$ between the high side drive circuit and n$^{++}$ type high concentration region 12a is 100 μm or more.

As the second interval $x_2$ between the high side drive circuit and n$^{++}$ type high concentration region 12a is 100 μm or more in places in which the cavity 11 and p-type diffusion region 13 are not formed, holes flowing from the p-type GND region 41 into the high side drive circuit formation region 10 when the negative surge 122a occurs do not reach the high side drive circuit. Consequently, the cavity 11 and p-type diffusion region 13 may be provided or may be not provided between the high side drive circuit and p-type GND region 41 in places in which the cavity 11 and p-type diffusion region 13 are not formed. When the cavity 11 and p-type diffusion region 13 are provided between the high side drive circuit and p-type GND region 41 in places in which the cavity 11 and p-type diffusion region 13 are not formed, the cavity 11 and p-type diffusion region 13 are both disposed so as to enclose the high side drive circuit formation region 10 on the four sides of the p-type semiconductor substrate 1.

The thickness of the cavity 11 is set so that it is possible to ensure a desired punch-through breakdown voltage or higher. Generally, a breakdown voltage Vbr of a dielectric isolation semiconductor device when not losing the RESURF (REduced SURface electric Field) effect is expressed by Expression (1) below based on Poisson's equation. Herein, a critical voltage Ecr, a thickness d of the n-type epitaxial region 12, a thickness Tox of a dielectric layer, silicon (Si) relative permittivity $\in_{Si}$, and dielectric relative permittivity cox are assumed.

$$Vbr = Ecr \times (d/2 + Tox \times \in_{Si}/\in ox) \qquad (1)$$

When fabricating a high side drive circuit with a breakdown voltage of 1,200V, a breakdown voltage of in the region of at least 1,500V is required when taking into consideration variation in the resistivity of the n-type epitaxial region 12, variation in the thickness of the cavity 11, and furthermore, the actual breakdown voltage of the external power module 100 (upper and lower arm output elements), and the like. When the dielectric layer is the cavity 11, the dielectric relative permittivity $\in$ox is 1. For example, when d is 10 μm and Tox is 4 μm, Ecr is 3×10$^5$ (V/cm), $\in$ox is 1, and $\in_{Si}$ is 11.7, because of which, it can be assumed from Equation (1) above that Vbr is 1,550V.

In order to achieve an increase in the breakdown voltage of the dielectric isolation semiconductor device based on Equation (1) above, it is sufficient that the thickness of the n-type epitaxial region 12 or dielectric layer (cavity 11) is increased. However, when increasing the thickness of the cavity 11, the cavity 11 is crushed due to the weight of the n-type epitaxial region 12 disposed above the cavity 11. Consequently, it is preferable that the thickness of the cavity 11 is in the region of 4 μm to 6 μm.

The gate electrodes 23 and 33, source electrode, drain electrode, VB electrode, Vs electrode and GND electrode are electrically isolated from each other by an interlayer dielectric. Also, the surface of the p-type semiconductor substrate 1 on the side on which the surface element structure is formed is protected by a passivation film (not shown). The interlayer dielectric may be, for example, a silicon dioxide film (SiO$_2$ film) formed of LOCOS (Local Oxidation of Silicon), TEOS (TetraEthOxySilane), BPSG (Boro-Phospho-Silicate Glass), or the like, which are field oxide films. The passivation film may be a silicon nitride film (Si$_3$N$_4$ film) or a polyimide film.

Figure 3:
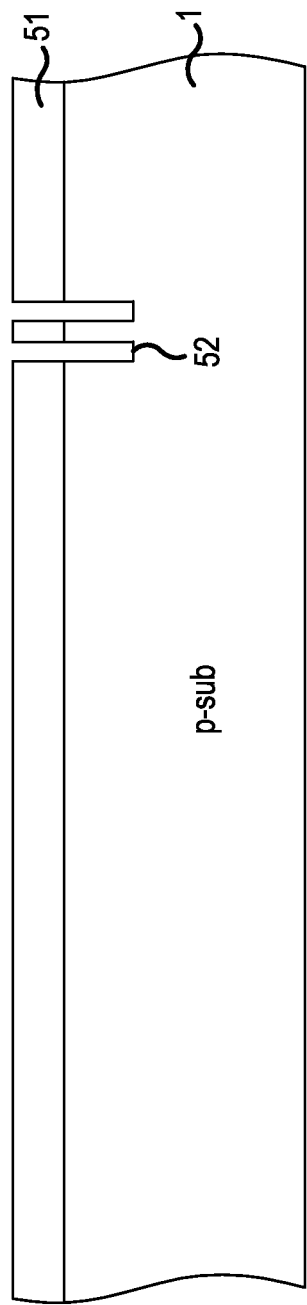
FIG. 3 is a sectional view showing a state partway through the manufacture of the semiconductor integrated circuit device according to Embodiment 1.

Next, a description will be given of a method of manufacturing the semiconductor integrated circuit device according to Embodiment 1, with a case of fabricating (manufacturing) a high side drive circuit with a high breakdown voltage in the region of 600V to 1,200V as an example. FIGS. 3 to 8 are sectional views showing states partway through the manufacture of the semiconductor integrated circuit device according to Embodiment 1. Firstly, the p-type semiconductor substrate 1, with a resistivity of in the region of, for example, 100 Ω·cm to 400 Ω·cm, is prepared, as shown in FIG. 3. Next, a thermal oxide film is formed by thermal oxidation on the surface of the p-type semiconductor substrate 1, and the thermal oxide film is patterned by photolithography, forming a mask oxide film 51 for trench etching.

Figure 4:
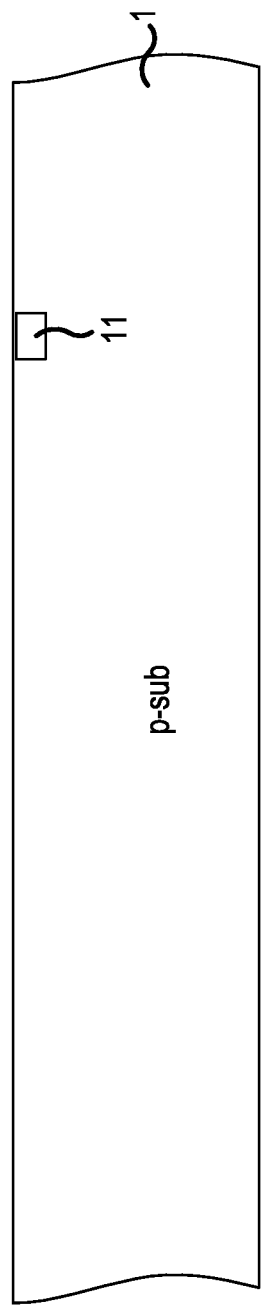
FIG. 4 is a sectional view showing a state partway through the manufacture of the semiconductor integrated circuit device according to Embodiment 1.

Next, dry etching, for example, is carried out using the mask oxide film 51 as a mask, forming a plurality of trenches 52 in the cavity 11 formation region in the p-type semiconductor substrate 1. Next, after the mask oxide film 51 is removed by, for example, wet etching, an annealing process is carried out at a temperature in the region of 1,000° C. to 1,200° C. in an inert gas atmosphere of, for example, hydrogen ($H_2$) gas, or the like. By so doing, aperture portions of the trenches 52 are closed off, and the plurality of trenches 52 are integrated, whereby the cavity 11 is formed to a thickness of in the region of 2 μm to 6 μm, for example, 4 μm (silicon atom surface migration), as shown in FIG. 4.

The method of forming the cavity 11 in a surface layer of the p-type semiconductor substrate 1 not being limited to this, various changes are possible. For example, porous silicon is selectively formed on the surface of the p-type semiconductor substrate 1 by electrolytic etching or the like. Then, the n-type epitaxial region 12, to be described hereafter, is grown on the p-type semiconductor substrate 1, covering the porous silicon. Subsequently, by a high temperature annealing process being carried out in an inert gas atmosphere, the porous silicon is caused to be absorbed by the peripheral p-type semiconductor substrate 1 and n-type epitaxial region 12, and the portion in which the porous silicon is formed may be adopted as the cavity 11.

Figure 5:
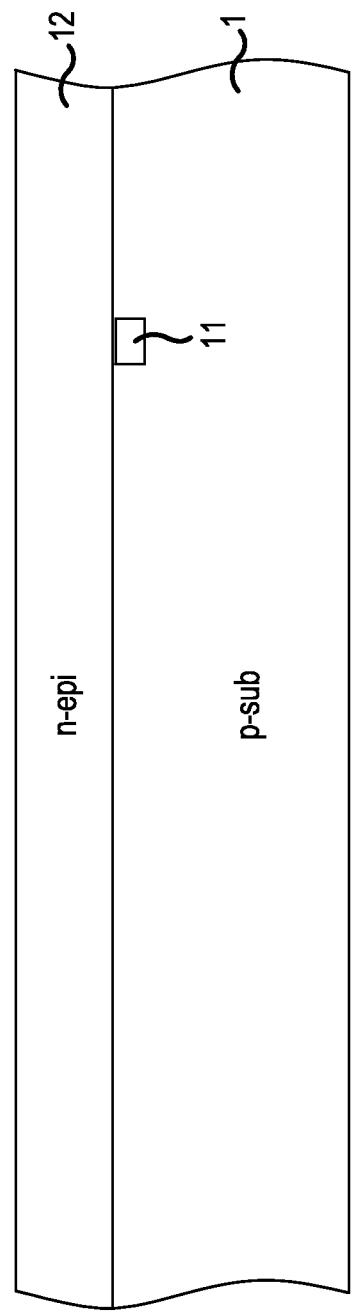
FIG. 5 is a sectional view showing a state partway through the manufacture of the semiconductor integrated circuit device according to Embodiment 1.

Next, the n-type epitaxial region 12 is grown to a thickness of in the region of 5 μm to 50 μm, for example, 10 μm, on the p-type semiconductor substrate 1 (on the surface on the side on which the cavity 11 is formed), as shown in FIG. 5. The impurity concentration of the n-type epitaxial region 12 may be in the region of, for example, $1 \times 10^{14}/cm^3$ to $1 \times 10^{16}/cm^3$.

Figure 6:
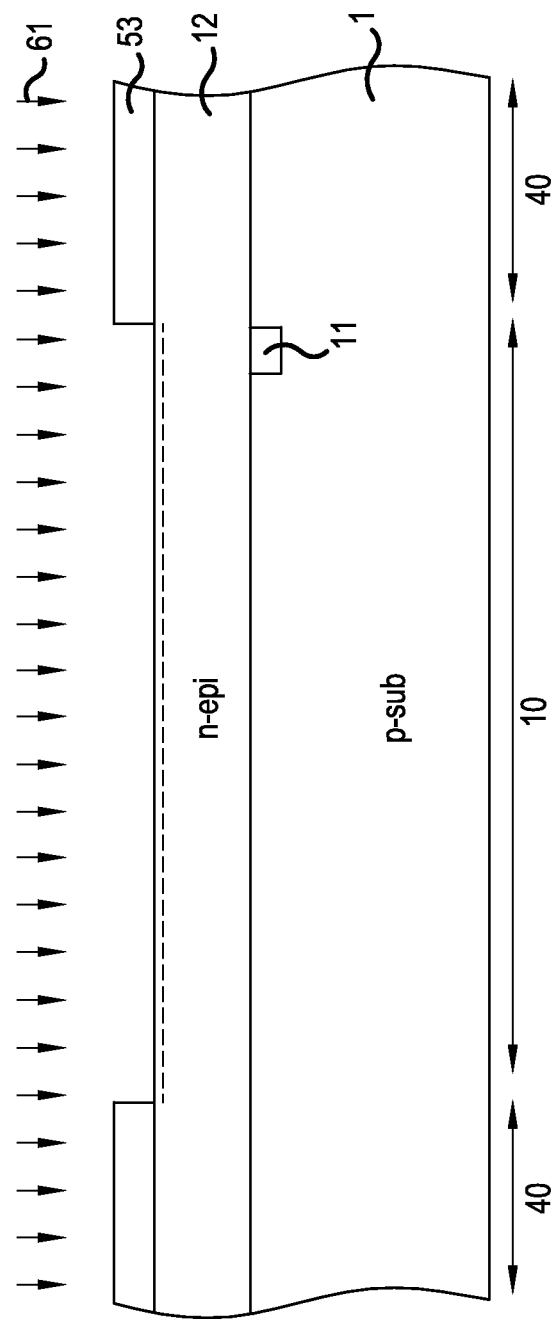
FIG. 6 is a sectional view showing a state partway through the manufacture of the semiconductor integrated circuit device according to Embodiment 1.

Next, a resist mask 53 is formed on the surface of the n-type epitaxial region 12, exposing the high side drive circuit formation region 10, as shown in FIG. 6. Next, a first ion implantation 61 of an n-type impurity such as, for example, phosphorus (P) is carried out with the resist mask 53 as a mask. In FIG. 6, the dotted line in the vicinity of the n-type epitaxial region 12 surface represents the n-type impurity implanted by the first ion implantation 61 (the same applies to FIG. 7). The dose of the n-type impurity in the first ion implantation 61 may be in the region of, for example, $5 \times 10^{12}/cm^2$ to $5 \times 10^{13}/cm^2$. Then, the resist mask 53 is removed.

Figure 7:
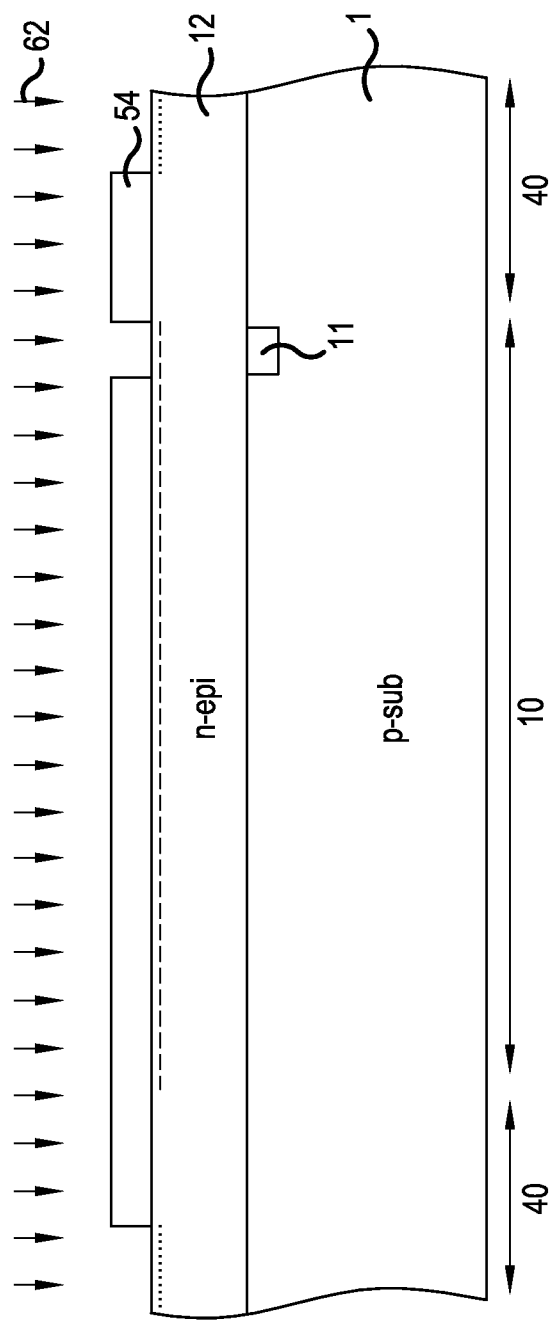
FIG. 7 is a sectional view showing a state partway through the manufacture of the semiconductor integrated circuit device according to Embodiment 1.

Next, a resist mask 54 is formed on the surface of the n-type epitaxial region 12, exposing the formation regions of the p-type diffusion region 13 and p-type GND region 41, as shown in FIG. 7. Next, a second ion implantation 62 of a p-type impurity such as, for example, boron (B) is carried out with the resist mask 54 as a mask. The dose of the p-type impurity in the second ion implantation 62 may be in the region of, for example, $1 \times 10^{12}/cm^2$ to $1 \times 10^{14}/cm^2$. In FIG. 7, a dotted line in the vicinity of the n-type epitaxial region 12 surface (the dotted line finer than the dotted line indicating the n-type impurity) represents the p-type impurity implanted by the second ion implantation 62. Then, the resist mask 54 is removed. The first and second ion implantations 61 and 62 may be carried out in reverse order.

Figure 8:
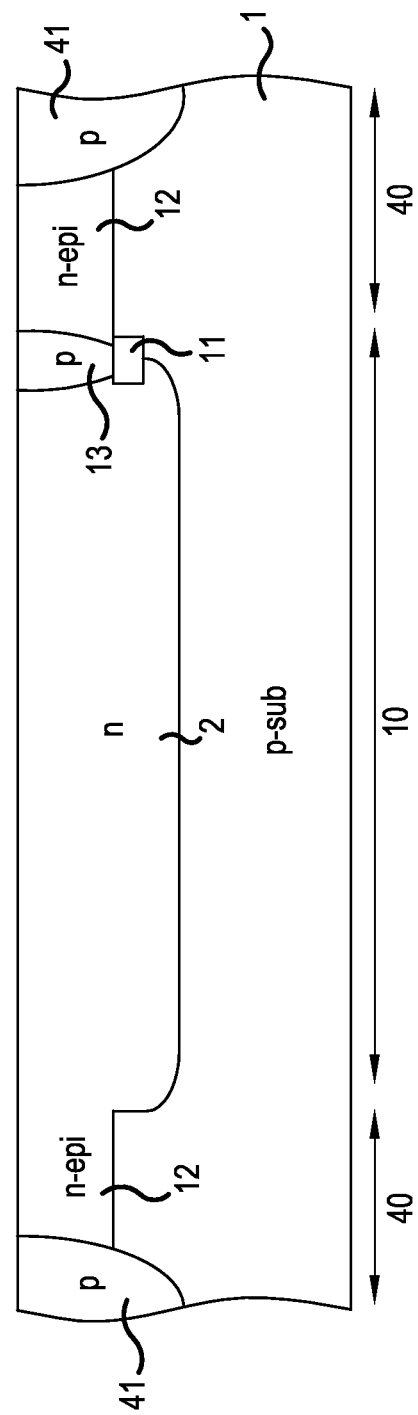
FIG. 8 is a sectional view showing a state partway through the manufacture of the semiconductor integrated circuit device according to Embodiment 1.

Next, an annealing process is carried out for in the region of 10 hours at a temperature of in the region of, for example, 1,100° C. to 1,200° C., causing the n-type impurity and p-type impurity implanted into the n-type epitaxial region 12 by the first and second ion implantations 61 and 62 to diffuse. By so doing, the n-type isolation region 2, p-type diffusion region 13, and p-type GND region 41 are each formed to a predetermined depth in the interior of the n-type epitaxial region 12, as shown in FIG. 8. The annealing process is carried out so that the p-type impurity implanted into the p-type diffusion region 13 formation region is diffused as far as the cavity 11.

As the n-type isolation region 2 is formed by the n-type impurity of the first ion implantation 61 being diffused in the annealing process, the depth of the n-type isolation region 2 is greater than that of the n-type epitaxial region 12. Also, an end portion of the n-type isolation region 2 is diffused so as to cover an end portion (on the p-type semiconductor substrate 1 side) of the cavity 11. That is, the cavity 11 is disposed between the p-type diffusion region 13 and p-type semiconductor substrate 1 in the depth direction of the p-type semiconductor substrate 1.

Next, a resist mask (not shown) is formed on the surfaces of the n-type isolation region 2 and n-type epitaxial region 12, exposing the formation region of the p-type isolation region 3. Next, a third ion implantation of a p-type impurity such as, for example, boron is carried out with the resist mask as a mask. The dose of the p-type impurity in the third ion implantation may be in the region of, for example, $1 \times 10^{13}/cm^2$ to $1 \times 10^{14}/cm^2$. Then, the third ion implantation resist mask is removed.

Next, a resist mask (not shown) is formed on the surfaces of the n-type isolation region 2 and n-type epitaxial region 12, exposing the formation regions of the $p^+$ type source region 21 and $p^+$ type drain region 22. Next, a fourth ion implantation of a p-type impurity such as, for example, boron is carried out with the resist mask as a mask. The dose of the p-type impurity in the fourth ion implantation may be in the region of, for example, $5 \times 10^{12}/cm^2$ to $1 \times 10^{14}/cm^2$. Then, the fourth ion implantation resist mask is removed.

Next, a resist mask (not shown) is formed on the surfaces of the n-type isolation region 2 and n-type epitaxial region 12, exposing the formation regions of the $n^+$ type source region 31 and $n^+$ type drain region 32. Next, a fifth ion implantation of an n-type impurity such as, for example, phosphorus is carried out with the resist mask as a mask. The dose of the n-type impurity in the fifth ion implantation may be in the region of, for example, $5 \times 10^{12}/cm^2$ to $1 \times 10^{14}/cm^2$. Then, the fifth ion implantation resist mask is removed.

Next, a resist mask (not shown) is formed on the surfaces of the n-type isolation region 2 and n-type epitaxial region 12, exposing the formation regions of the $p^{++}$ type high concentration regions 41a, 3a, and 13a. Next, a sixth ion implantation of a p-type impurity such as, for example, boron is carried out with the resist mask as a mask. The dose of the p-type impurity in the sixth ion implantation may be in the region of, for example, $5 \times 10^{14}/cm^2$ to $5 \times 10^{15}/cm^2$. At this time, as well as the $p^{++}$ type high concentration regions 41a, 3a, and 13a, a $p^{++}$ type high concentration region omitted from the drawing is also formed on each of the $p^+$ type source region 21 and $p^+$ type drain region 22 surfaces of the MV-PMOS 20. Then, the sixth ion implantation resist mask is removed. A $p^{++}$ type high concentration region for ohmic contact with each electrode is formed in the sixth ion implantation.

Next, a resist mask (not shown) is formed on the surfaces of the n-type isolation region 2 and n-type epitaxial region 12, exposing the formation regions of the $n^{++}$ type high concentration regions 2a and 12a. Next, a seventh ion implantation of an n-type impurity such as, for example, arsenic is carried out with the resist mask as a mask. The dose of the n-type impurity in the seventh ion implantation may be in the region of, for example, $5 \times 10^{14}/cm^2$ to $5 \times 10^{15}/cm^2$. At this time, as well as the $n^{++}$ type high concentration regions 2a and 12a, an $n^{++}$ type high concentration region omitted from the drawing is also formed in each of the $n^+$ type source region 31 and $n^+$ type drain region 32 of the MV-NMOS 30. Then, the seventh ion implantation resist mask is removed. An $n^{++}$ type high concentration region for ohmic contact with each electrode is formed in the seventh ion implantation. The third to seventh ion implantations may be carried out in a different order.

Next, an activation annealing process is carried out for in the region of 4 hours at a temperature of in the region of, for example, 900° C. to 1,100° C., causing the n-type impurities and p-type impurities implanted into the n-type isolation region 2 and n-type epitaxial region 12 by the third to seventh ion implantations to diffuse. By so doing, the p-type isolation region 3, $p^+$ type source region 21 and $p^+$ type drain region 22, $n^+$ type source region 31 and $n^+$ type drain region 32, and $n^{++}$ type high concentration regions 2a and 12a and $p^{++}$ type high concentration regions 3a, 13a, and 41a connected to each electrode, are formed. Subsequently, the gate electrodes 23 and 33, source electrode, drain electrode, VB electrode, Vs electrode, and GND electrode are formed, and the high side drive circuit shown in FIGS. 1 and 2 is completed by an interlayer dielectric, passivation film, and the like, being formed.

According to Embodiment 1, as heretofore described, the cavity is formed between the p-type GND region provided in the HVJT and the high side drive circuit provided in the high side drive circuit formation region, and by the p-type diffusion region being provided above the cavity to a depth reaching the cavity, it is possible to extract holes flowing from the p-type GND region into the p-type isolation region when negative surge occurs in the connection point of the upper and lower arm output elements, and thus possible to reduce (practically eliminate) hole implantation. Because of this, even when driving an inverter device wherein the upper arm output element load current, or floating inductance (L component) accompanying the load, is large, it is possible to prevent the high side drive circuit from malfunctioning or being destroyed.

Also, according to Embodiment 1, the p-type diffusion region is not deeper than a depth reaching the cavity, because of which it is possible to prevent the hole pick-up p-type diffusion region from punching through to the p-type semiconductor substrate due to a transient rise of the intermediate potential. Also, according to Embodiment 1, hole implantation is reduced (practically eliminated) by providing the hole pick-up p-type diffusion region to a depth reaching the cavity, because of which it is sufficient that the interval between the $n^{++}$ type high concentration region to which the high side power supply potential is connected and the high side drive circuit is an interval in the region of the 15 µm width of the hole pick-up p-type diffusion region, and there is no longer any need for a separation of 100 µm or more. Consequently, it is possible to reduce chip size, and thus possible to reduce cost.

Also, according to Embodiment 1, the pick-up p-type diffusion region can be formed simultaneously with the p-type GND region by ion implantation and an annealing process, because of which the heretofore described high side drive circuit can be fabricated simply by adding the step of providing the cavity in the interior of the p-type semiconductor substrate to a heretofore known high side drive circuit manufacturing process. Also, according to Embodiment 1, it is sufficient that the cavity is provided only in the region in the semiconductor substrate in which the p-type diffusion region is formed, because of which it is possible to suppress warping of the semiconductor substrate during the manufacture of the high side drive circuit.

Embodiment 2

Figure 15:
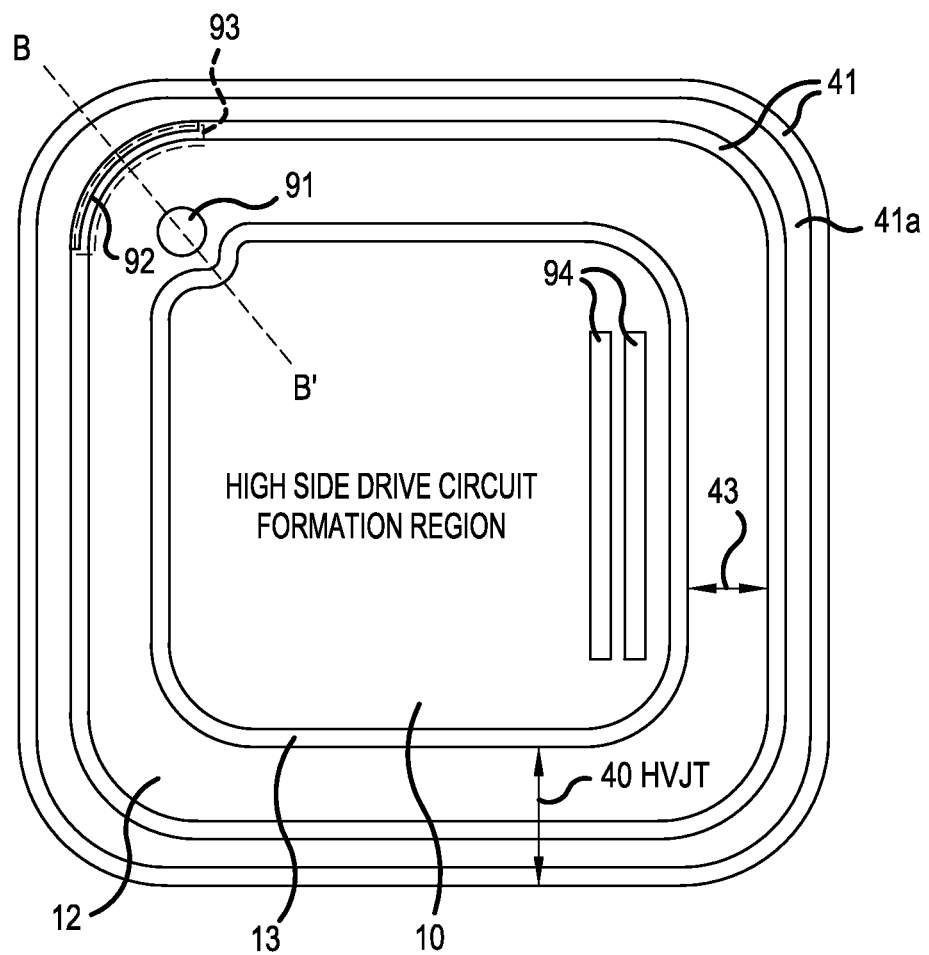
FIG. 15 is a plan view showing a planar structure of a semiconductor integrated circuit device according to Embodiment 2.
Figure 16:
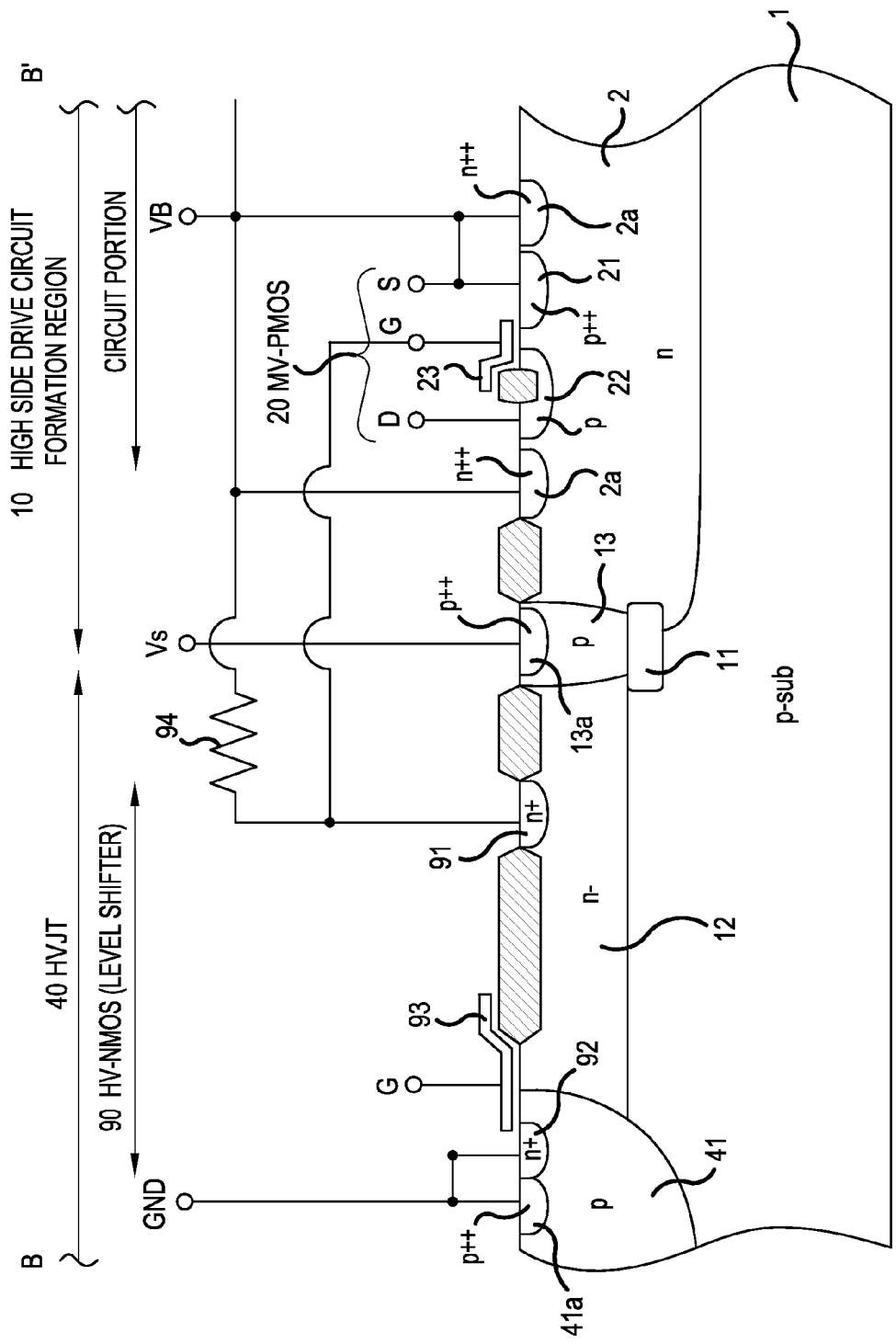
FIG. 16 is a sectional view showing a sectional structure along a section line B-B' of FIG. 15.

Next, a description will be given of a semiconductor integrated circuit device according to Embodiment 2. FIG. 15 is a plan view showing a planar structure of the semiconductor integrated circuit device according to Embodiment 2. FIG. 16 is a sectional view showing a sectional structure along a section line B-B' of FIG. 15. The semiconductor integrated circuit device according to Embodiment 2 differs from the semiconductor integrated circuit device according to Embodiment 1 in that, in a self-shielding type high side drive circuit wherein a level shifter is integrated with the HVJT 40, no $n^{++}$ type high concentration region (corresponding to reference sign 12a of FIG. 14) for applying (picking-up) the high side power supply potential VB to the HVJT 40 is provided in the n-type epitaxial region ($n^-$ type region) 12.

In Embodiment 2, it is possible to reduce the chip size by an amount commensurate with no $n^{++}$ type high concentration region being provided in the n-type epitaxial region 12. Specifically, it is possible to reduce the chip size by in the region of 10 µm that is the width of the $n^{++}$ type high concentration region, and 10 µm that is the interval between the $n^{++}$ type high concentration region and p-type diffusion region 13, a total of 20 µm. The $n^{++}$ type high concentration region and p-type diffusion region 13 are disposed so as to enclose the periphery of the high side drive circuit formation region 10, and as the peripheral length thereof is approximately 2 mm, it is possible to reduce the chip area by an amount equivalent to, for example, 2 mm×20 µm.

Also, when an $n^{++}$ type high concentration region is provided in the n-type epitaxial region 12, an $n^{++}$ type high concentration region with the high side power supply potential VB, higher than the potential of the p-type diffusion region 13 with the intermediate potential Vs, is disposed between the p-type GND region 41 and p-type diffusion region 13, because of which, when negative surge occurs and a parasitic diode formed of the p-type GND region 41 and n-type epitaxial region 12 is turned on, there occurs a phenomenon whereby holes flowing from the p-type GND region 41 to the high side drive circuit formation region 10, besides being extracted from the p-type diffusion region 13, flow from the $n^{++}$ type high concentration region in the interior of the n-type epitaxial region 12 to the n-type isolation region 2 via internal wiring.

Meanwhile, in Embodiment 2, no $n^{++}$ type high concentration region is provided in the n-type epitaxial region 12, because of which all the holes flowing from the p-type GND region 41 are extracted in the p-type diffusion region 13, and no holes flow into the high side drive circuit formation region 10 along a path passing through the HVJT 40. When negative surge occurs and the high side power supply potential VB becomes lower than the ground potential GND, a parasitic diode formed of the p-type GND region 41 and p-type semiconductor substrate 1 and the n-type isolation region 2 is turned on as well as the parasitic diode formed of the p-type GND region 41 and n-type epitaxial region 12, but as the p-type semiconductor substrate 1 is of high resistance, hole implantation from the p-type semiconductor substrate 1 to the n-type isolation region 2 is slight.

Also, when an $n^{++}$ type high concentration region is provided in the n-type epitaxial region 12, it is used as a diffusion resistor formed of the n-type epitaxial region 12 in a portion of the level shifter sandwiched between the $n^+$ type drain region 91 and $n^{++}$ type high concentration region, but in Embodiment 2, it is sufficient that a polysilicon layer is used as a level shift resistor 94 instead of the diffusion resistor formed of the diffusion layer. In this case, for example, it is sufficient that a polysilicon layer is formed on the chip (for example, on a LOCOS film) in the high side drive circuit formation region 10, and that the polysilicon layer is used as the level shift resistor 94. As the polysilicon layer is formed on the chip, the chip size does not increase. Also, as the diffusion resistor formed of the diffusion layer is not used as the level shift resistor 94, the resistance value of the level shift resistor 94 does not vary in accordance with the degree of depletion of the n-type epitaxial region 12 caused by the turning on and off of the upper and lower arm output elements. Also, a diffusion resistor formed of the n-type isolation region 2 of the high side drive circuit formation region 10 may be used as the level shift resistor 94. As the n-type isolation region 2 is of a higher impurity concentration than the n-type epitaxial region 12, there is no fluctuation in the resistance value of the level shift resistor 94 due to depletion of the n-type isolation region 2. Consequently, by the level shift resistor 94 being provided in the high side drive circuit formation region 10, it is possible to realize stable signal transmission.

The $n^+$ type drain region 91 of the level shifter is connected via internal wiring disposed on the front surface side of the p-type semiconductor substrate 1 to the level shift resistor 94, and connected via the level shift resistor 94 to the $n^{++}$ type high concentration region 2a provided in the interior of the n-type isolation region 2 of the high side drive circuit formation region 10. That is, the $n^{++}$ type high concentration region 2a provided in the interior of the n-type isolation region 2 functions as a pick-up contact for applying the high side power supply potential VB to the HVJT 40. The cavity 11 may extend from the p-type diffusion region 13 to the p-type GND region 41, in the same way as in Embodiment 1. Instead of the cavity 11, a dielectric layer such as a $SiO_2$ film may be selectively embedded between the p-type semiconductor substrate 1 and n-type epitaxial region 12 (partial SOI). In this case, it is good when the thickness of the dielectric layer is greater than the thickness of the cavity 11. For example, when embedding a $SiO_2$ film instead of the cavity 11, it is good when the thickness of the $SiO_2$ film is 15 μm or more, in order to ensure a breakdown voltage of 1,500V or more.

Also, the semiconductor integrated circuit device according to Embodiment 2 may also be applied to a wire bonding method. In this case, it is sufficient to adopt a configuration such that the $n^+$ type drain region 91 and $n^+$ type source region 92 of the HV-NMOS 90 are not provided. By so doing, the n-type epitaxial region 12 sandwiched between the p-type GND region 41 and p-type diffusion region 13 is in a floating state, but the potential of the n-type epitaxial region 12 is higher than the intermediate potential Vs by a 0.6V potential barrier of a p-n junction between the p-type GND region 41 and n-type epitaxial region 12 (=Vs+0.6V). Because of this, it is possible to ensure a breakdown voltage of 1,200V or more between the p-type GND region 41 and n-type epitaxial region 12.

As heretofore described, according to Embodiment 2 it is possible to obtain the same advantages as in Embodiment 1.

The invention, not being limited to the heretofore described embodiments, is applicable to various configurations of circuit used with a high voltage power supply. For example, the invention is applicable to a wire bonding type or self-shielding type of high side drive circuit. Also, each of an upper arm output element and lower arm output element configuring a high voltage driver IC may be an IGBT (insulated gate bipolar transistor). When the upper and lower arm output elements are IGBTs, a connection point of the emitter of a first IGBT, which forms the upper arm output element, and the collector of a second IGBT, which forms the lower arm output element, forms an output point of a main circuit formed of a power module.

Also, it is sufficient that the low potential side potential of the main power supply of the high voltage driver IC is a potential lower than the high potential side potential of the main power supply. Also, in each of the heretofore described embodiments, a description is given with a case wherein a cavity is provided in the interior of the semiconductor substrate as an example, but a partial SOI (Silicon On Insulator) substrate may be configured by a dielectric layer such as a $SiO_2$ film being provided instead of the cavity. When adopting a partial SOI substrate, it is preferable that the thickness of the dielectric layer in the partial SOI substrate is, for example, 15 μm or more in order to realize a breakdown voltage of 1,500V or more. Also, in each embodiment, the first conductivity type is a p-type and the second conductivity type is an n-type, but the invention is established in the same way when the first conductivity type is an n-type and the second conductivity type is a p-type.

As heretofore described, the semiconductor integrated circuit device according to the invention is useful in a power semiconductor device used in, besides a motor control inverter, a power supply application of a PDP or liquid crystal panel with a large capacitive load, an inverter application for a household appliance such as an air conditioner or lighting, and the like.

What is claimed is:

1. A semiconductor integrated circuit device, comprising:
   a second conductivity type region, provided in a surface layer of a first conductivity type semiconductor substrate, in which a circuit portion is formed and to which is applied a first potential, which is a high voltage potential of a power supply of the circuit portion;
   a first conductivity type well region, provided in the interior of the second conductivity type region and configuring the circuit portion, to which is applied a second potential, which is a low voltage potential of the power supply;
   a first conductivity type low potential region, provided in a surface layer of the first conductivity type semiconductor substrate on the outer side of the second conductivity type region, to which is applied a third potential lower than the second potential;
   a cavity selectively provided between the circuit portion and first conductivity type low potential region and between the first conductivity type semiconductor substrate and second conductivity type region; and
   a first conductivity type region penetrating the second conductivity type region and reaching the cavity.

2. The semiconductor integrated circuit device according to claim 1, wherein the second potential is applied to the first conductivity type region.

3. The semiconductor integrated circuit device according to claim 1, wherein the cavity extends from the first conductivity type region toward the first conductivity type low potential region side.

4. The semiconductor integrated circuit device according to claim 1, wherein the cavity is provided from the first conductivity type region to the first conductivity type low potential region.

5. The semiconductor integrated circuit device according to claim 1, wherein
   the circuit portion drives a first element of an output circuit configured of the first element connected to a high voltage potential side of a main power supply and a second element connected in series to the first element and connected to a low voltage potential side of the main power supply,
   the second potential is the potential of a connection point of the first element and second element, and the third potential is the low voltage potential of the main power supply.

6. The semiconductor integrated circuit device according to claim 5, wherein a punch-through breakdown voltage of the first conductivity type region and first conductivity type semiconductor substrate is set to be higher than the potential of the connection point of the first element and second element of the output circuit, which transiently rises when the first element is in an on-state and the second element is in an off-state.

7. The semiconductor integrated circuit device according to claim 1, further comprising:
a voltage withstand region enclosing the circuit portion and disposed in the second conductivity type region; and
an insulated gate field effect transistor configuring a level shifter having the drain on the inner side of the voltage withstand region and the source on the outer side of the voltage withstand region, wherein
the cavity is disposed between the circuit portion and the drain of the insulated gate field effect transistor.

8. A semiconductor integrated circuit device, comprising:
a first second conductivity type region, provided in a surface layer of a first conductivity type semiconductor substrate, in which a circuit portion is formed and to which is applied a first potential, which is a high voltage potential of a power supply of the circuit portion;
a first conductivity type well region, provided in the interior of the first second conductivity type region and configuring the circuit portion, to which is applied a second potential, which is a low voltage potential of the power supply;
a second second conductivity type region provided in a surface layer of the first conductivity type semiconductor substrate on the outer side of the first second conductivity type region;
a first conductivity type low potential region, provided in a surface layer of the first conductivity type semiconductor substrate on the outer side of the second second conductivity type region, to which is applied a third potential lower than the second potential;
a cavity selectively provided between the circuit portion and first conductivity type low potential region and between the first conductivity type semiconductor substrate and second second conductivity type region;
a first conductivity type region, provided between the first second conductivity type region and second second conductivity type region, penetrating the second second conductivity type region and reaching the cavity; and
an insulated gate field effect transistor configuring a level shifter, disposed in the second second conductivity type region, wherein a second conductivity type high concentration region connected to the first potential is not disposed in a portion of the second second conductivity type region sandwiched between the drain of the insulated gate field effect transistor and the first conductivity type region.

9. The semiconductor integrated circuit device according to claim 8, wherein the second potential is applied to the first conductivity type region.

10. The semiconductor integrated circuit device according to claim 8, wherein the cavity is disposed between the circuit portion and the drain of the insulated gate field effect transistor.

11. The semiconductor integrated circuit device according to claim 8, wherein
the drain of the insulated gate field effect transistor is disposed on the circuit portion side of the second second conductivity type region, and
the source of the insulated gate field effect transistor is disposed on the first conductivity type low potential region side of the second second conductivity type region.

12. The semiconductor integrated circuit device according to claim 8, wherein
the circuit portion drives a first element of an output circuit configured of the first element connected to a high voltage potential side of a main power supply and a second element connected in series to the first element and connected to a low voltage potential side of the main power supply,
the second potential is the potential of a connection point of the first element and second element, and
the third potential is the low voltage potential of the main power supply.

13. The semiconductor integrated circuit device according to claim 12, wherein a punch-through breakdown voltage of the first conductivity type region and first conductivity type semiconductor substrate is set to be higher than the potential of the connection point of the first element and second element of the output circuit, which transiently rises when the first element is in an on-state and the second element is in an off-state.

14. The semiconductor integrated circuit device according to claim 8, further comprising
a resistance layer provided across a dielectric on the surface of the first second conductivity type region, wherein
the drain of the insulated gate field effect transistor is electrically connected to the resistance layer via a wiring layer disposed on the first conductivity type semiconductor substrate.

* * * * *